United States Patent [19]
Bernhardt

[11] Patent Number: 5,218,515
[45] Date of Patent: Jun. 8, 1993

[54] MICROCHANNEL COOLING OF FACE DOWN BONDED CHIPS

[75] Inventor: Anthony F. Bernhardt, Berkeley, Calif.

[73] Assignee: The United States of America as represented by the United States Department of Energy, Washington, D.C.

[21] Appl. No.: 850,634

[22] Filed: Mar. 13, 1992

[51] Int. Cl.⁵ .............................................. H05K 7/20
[52] U.S. Cl. .................................. 361/385; 361/382; 361/386; 361/412; 257/712; 257/714
[58] Field of Search ...................... 174/16.3; 165/80.4, 165/185; 357/81, 82; 361/381, 382, 385–389, 392, 394, 412

[56] References Cited

U.S. PATENT DOCUMENTS

| | | | |
|---|---|---|---|
| 3,527,989 | 9/1970 | Cuzner et al. | 361/381 |
| 3,551,758 | 1/1969 | Ferree | 357/82 |
| 4,450,472 | 5/1984 | Tuckerman et al. | |
| 4,489,363 | 12/1984 | Goldberg | |
| 4,525,921 | 7/1985 | Carson et al. | |
| 4,573,067 | 2/1986 | Tuckerman et al. | |
| 4,646,128 | 2/1987 | Carson et al. | |
| 4,686,606 | 8/1987 | Yamada et al. | 361/385 |
| 4,748,495 | 5/1988 | Kucharek et al. | 361/382 |
| 4,800,956 | 1/1989 | Hamburgen | 361/386 |
| 4,801,992 | 1/1989 | Golubic | |
| 4,833,568 | 5/1989 | Berhold | |
| 4,841,355 | 6/1989 | Parks | |
| 4,870,477 | 9/1989 | Nakanishi et al. | 361/385 |
| 4,884,630 | 12/1989 | Nelson et al. | 165/80.4 |
| 4,893,174 | 1/1990 | Yamada et al. | |
| 4,894,709 | 1/1990 | Phillips et al. | |
| 4,992,847 | 2/1991 | Tuckerman | |
| 4,998,181 | 3/1991 | Haws et al. | 165/80.4 |
| 5,025,306 | 6/1991 | Johnson et al. | |
| 5,099,311 | 3/1992 | Bonde et al. | |

OTHER PUBLICATIONS

Goldman, et al.; "Area Array Solder Interconnections For VLSI", Solid State Technology; Jun.. 1983; pp. 91–97.

Goldberg; "Narrow Channel Forced Air Heat Sink"; IEEE Transactions on Components, Hybrids and Manufacturing Technology; vol. CHMT-7, No. 1, Mar., 1984; pp. 154–159.

Tuckerman, et al.; "High-Performance Heat Sinking For VLSI"; IEEE Electron Device Letters; vol. ED-2, No. 5, May, 1981; pp. 126–129.

Shanken, et al.; "Very High Density 3-D Packaging of Integrated Circuits"; published by Irvine Sensors Corporation; date unknown.

Primary Examiner—Gregory D. Thompson
Attorney, Agent, or Firm—Henry P. Sartorio; Roger S. Gaither; William R. Moser

[57] ABSTRACT

Microchannel cooling is applied to flip-chip bonded integrated circuits, in a manner which maintains the advantages of flip-chip bonds, while overcoming the difficulties encountered in cooling the chips. The technique is suited to either multichip integrated circuit boards in a plane, or to stacks of circuit boards in a three dimensional interconnect structure. Integrated circuit chips are mounted on a circuit board using flip-chip or control collapse bonds. A microchannel structure is essentially permanently coupled with the back of the chip. A coolant delivery manifold delivers coolant to the microchannel structure, and a seal consisting of a compressible elastomer is provided between the coolant delivery manifold and the microchannel structure. The integrated circuit chip and microchannel structure are connected together to form a replaceable integrated circuit module which can be easily decoupled from the coolant delivery manifold and the circuit board. The coolant supply manifolds may be disposed between the circuit boards in a stack and coupled to supplies of coolant through a side of the stack.

23 Claims, 7 Drawing Sheets

MICROCHANNEL COOLING OF FACE DOWN BONDED CHIPS

The United States government has rights in this invention pursuant to Contract Number W-7405-ENG-48 between the United States Department of Energy and the University of California for the operation of Lawrence Livermore National Laboratory.

CROSS REFERENCE TO RELATED APPLICATION

The present application is related to U.S. patent application entitled THREE DIMENSIONAL, MULTICHIP MODULE, Ser. No. 07/850,642, filed on the same day as the present application, and owned at the time of invention and currently by the same assignee.

BACKGROUND OF THE INVENTION

1. Field of the Invention

The present invention relates to cooling high power integrated circuits; and particularly to microchannel cooling of integrated circuits bonded face down on circuit boards, such as by flip-chip bonding.

2. Description of the Related Art

Many computer systems rely on so-called flip-chip bonding of die for electrical and mechanical attachment of integrated circuit chips to circuit boards. See, Goldman, et al., "Area Array Solder Interconnections for VLSI", SOLID STATE TECHNOLOGY, June, 1983, pp. 91–97. In flip-chip bonds, the integrated circuits are mounted face down on the circuit board. Solder bumps are coupled to bonding sites on the integrated circuits and corresponding bonding sites on the circuit board. The principal advantages of flip-chip bonding are a relative lack of electrical parasitics associated with the electrical connection, relatively high I/O available (in principal, at least), and repairability by removal and replacement of the chips. On the other hand, a significant difficulty is encountered in cooling flip-chip mounted chips. The solder bumps cover only a small fraction of the surface of the chip, and the underlying circuit boards are usually poor thermal conductors.

Heat is removed from commercial flip-chip systems using so-called thermal conduction module or TCM, such as described in the Goldman, et al. article cited above. However, the thermal conduction modules are very complex mechanically, and can only remove limited amounts of heat. As the power dissipated by integrated circuits increases, it is expected that the thermal conduction module technology will be insufficient.

One integrated circuit cooling technology which is capable of removing large amounts of heat is known as microchannel cooling. Microchannel cooling is described in detail in Tuckerman, et al., "High-Performance Heat Sinking for VLSI", IEEE ELECTRON DEVICE LETTERS, Vol. EDL-2, No. 5, May, 1981, pp. 126–129; Tuckerman, et al., U.S. Pat. No. 4,450,472; and Phillips, et al., U.S. Pat. No. 4,894,790.

Other microchannel cooling background is found in Goldberg, U.S. Pat. No. 4,489,363; and Goldberg, "Narrow Channel Forced Air Heat Sink", IEEE TRANSACTIONS ON COMPONENTS, HYBRIDS, AND MANUFACTURING TECHNOLOGY, Vol. CHMT-7, No. 1, March, 1984, pp. 154–159.

It has been proposed to apply microchannel type cooling to flip-chip bonded integrated circuits by Yamada, et al., U.S. Pat. No. 4,686,606. According to Yamada, et al., a grooved cooling module is bonded to a suction plate. The cooling module is coupled through a bellows-type tube to a manifold for delivering coolant to the structure. The suction plate contacts the backside of the integrated circuits through a silicone oil or other liquid, providing a suction joint at which the integrated circuit may be separated from the cooling structure.

The Yamada, et al. structure illustrates the mechanical complexity of supplying a flow of coolant through a microchannel structure that is in close thermal contact with an integrated circuit chip mounted face down on a circuit board. The integrated circuit chips will not lie perfectly flat on the circuit board, and will lay at varying heights, due to the manufacturing tolerances of flip-chip bonding. Thus, Yamada, et al. has devised this suction plate approach to making a good thermal contact with the chip. However, the suction plate envisioned by Yamada, et al requires use of a liquid which is a poor conductor of heat (in the case of oil) or which can contaminate and electrically short circuit the integrated circuits (in the case of liquid metals), and is believed to have other limitations which render it impractical.

It is desirable to provide a practical technique for applying microchannel cooling to flip-chip bonded integrated circuits, that allows for removal and replacement of individual chips, while taking advantage of the high efficiencies of microchannels in good thermal communication with the integrated circuit chips.

SUMMARY OF THE INVENTION

The present invention provides a technique for applying microchannel cooling to flip-chip bonded integrated circuits, which maintains all of the advantages of flip-chip bond, while overcoming the difficulties encountered in cooling the chips. Furthermore, the technique is suited to either multichip integrated circuit boards in a plane, or to stacks of circuit boards, in a three dimensional interconnect structure.

Thus, according to one aspect of the present invention, an integrated circuit package comprises a circuit board, and an integrated circuit chip having an integrated circuit formed on a first major surface. The chip is mounted on the circuit board so that the first major surface faces the circuit board using bonds, such as flip-chip or control collapse bonds. A microchannel structure is essentially permanently coupled with the second major surface of the chip, and provides a coolant flow path in heat flow communication with the chip. A coolant delivery manifold delivers coolant to the microchannel structure, and a removable, compressible seal is provided between the coolant delivery manifold and the microchannel structure.

The microchannel structure may comprise a grooved substrate bonded to the second major surface of the integrated circuit chip, with a cover manifold over the grooved substrate providing a coolant flow path through the grooves. Alternatively, the microchannel structure may comprise a plurality of grooves formed in the second major surface of the integrated circuit chip, and a corresponding cover manifold.

The seal in a preferred system comprises a compressible elastomer, so that coupling of the coolant delivery manifold to the microchannel structure may be securely made while tolerating differences in height of the integrated circuit chips, and without requiring large pressures which may damage the chips.

The package, according to this aspect, allows for removal and replacement of individual integrated circuit modules. Thus, a failed integrated circuit may be detected and located on a circuit board. The coolant supply manifold may be easily removed. The seal itself may be removable, or it may be affixed to either the manifold or the microchannel structure. This exposes flip-chip bonded integrated circuit modules that may be selectively removed and replaced using standard flip-chip bonding techniques. The seal and coolant supply manifold are then replaced and the structure is made whole again.

According to yet another aspect of the invention, the package comprises a stack of circuit boards, having flip-chip bonded integrated circuit modules as described above mounted on circuit boards in the stack. The coolant supply manifolds are disposed between the circuit boards and coupled to supplies of coolant at a side of the stack.

According to yet another aspect of the present invention, a replaceable integrated circuit module as described above is provided.

Other aspects and advantages of the present invention can be seen upon review of the figures, the detailed description, and the claims which follow.

DESCRIPTION OF THE PREFERRED EMBODIMENTS

FIGS. 1-8 illustrate embodiments of the present invention using "flip-chip" bonded integrated circuits with microchannel cooling on the top side of the integrated circuits.

Figure 1:
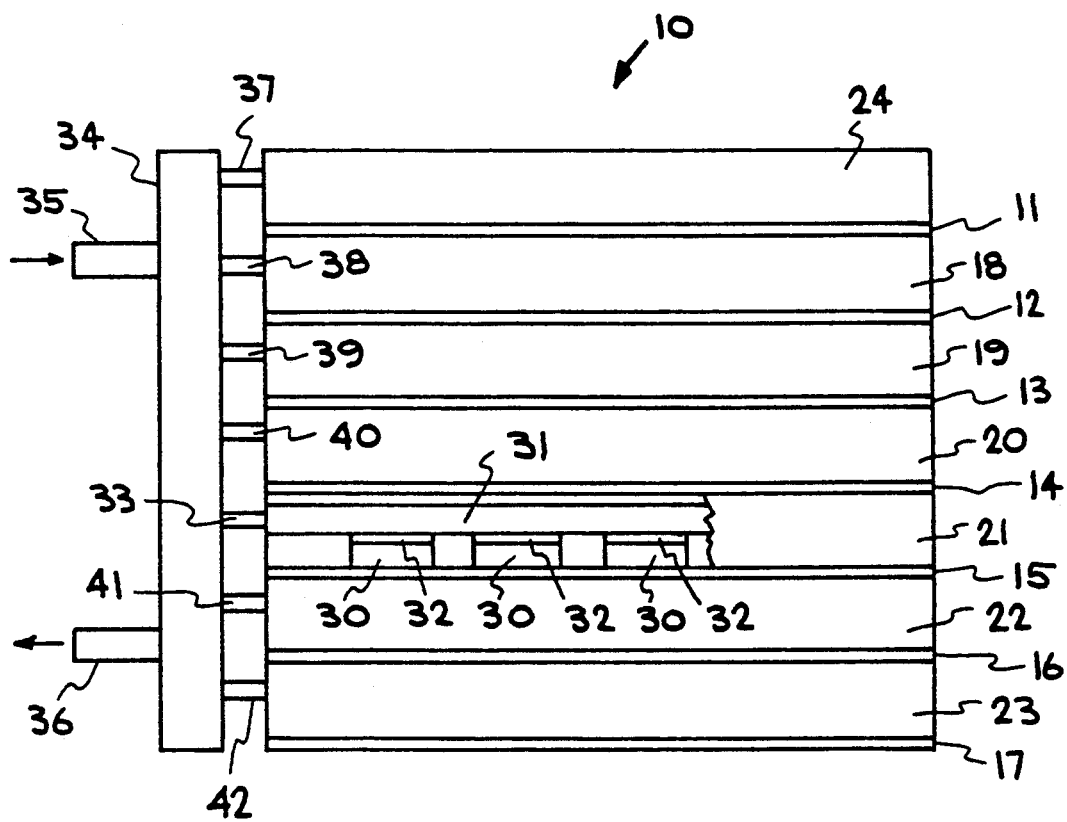
FIG. 1 is a schematic diagram of a stack of circuit boards with a coolant supply manifold according to the present invention.

FIG. 1 schematically illustrates a stack 10 of circuit boards 11-17. The circuit boards 11-17 are separated by perimeter wall members 18-23. The top circuit board 11 also has a perimeter wall member 24 bonded along the side for structural purposes. Such wall may or may not be necessary for a given embodiment.

The integrated circuit stack is implemented in the preferred embodiment according to the technology described in the above-referenced U.S. patent application entitled "THREE DIMENSIONAL, MULTI-CHIP MODULE", which is incorporated by reference in the present application as if fully set forth herein.

As shown schematically at the cutaway in FIG. 1, on circuit board 13, a plurality of integrated circuits, such as integrated circuit 30, are mounted on each circuit board using face down bonding, such as flip-chip technology. A coolant delivery manifold 31 is coupled at a compressible seal 32 to the individual integrated circuits. The coolant delivery manifold is, in turn, connected through tube 33 to a source 34 of coolant. A coolant input 35 and a coolant output 36 are used to provide the flow of coolant for the entire stack 10. As can be seen, each of the individual circuit boards in the stack includes its own coolant delivery manifold as evidenced by the tubes 37, 38, 33, 39, 40, 41, and 42.

In the embodiment shown in FIG. 1, the input and output ports for the coolant delivery manifolds are provided on the same side of the stack. Alternative systems may have an input manifold on one side and an output manifold on an opposite side, or other configurations as suit the particular mounting technology used for the stack.

Although FIG. 1 illustrates that the present invention is particularly suited for three dimensional stacks of circuit boards using flip-chip bonding techniques, the present invention is also well suited for a single, planar circuit board embodiment, or other geometries as may suit a particular application.

More details concerning the microchannel cooling structure according to the present invention are provided with respect to FIGS. 2-8.

Figure 2:
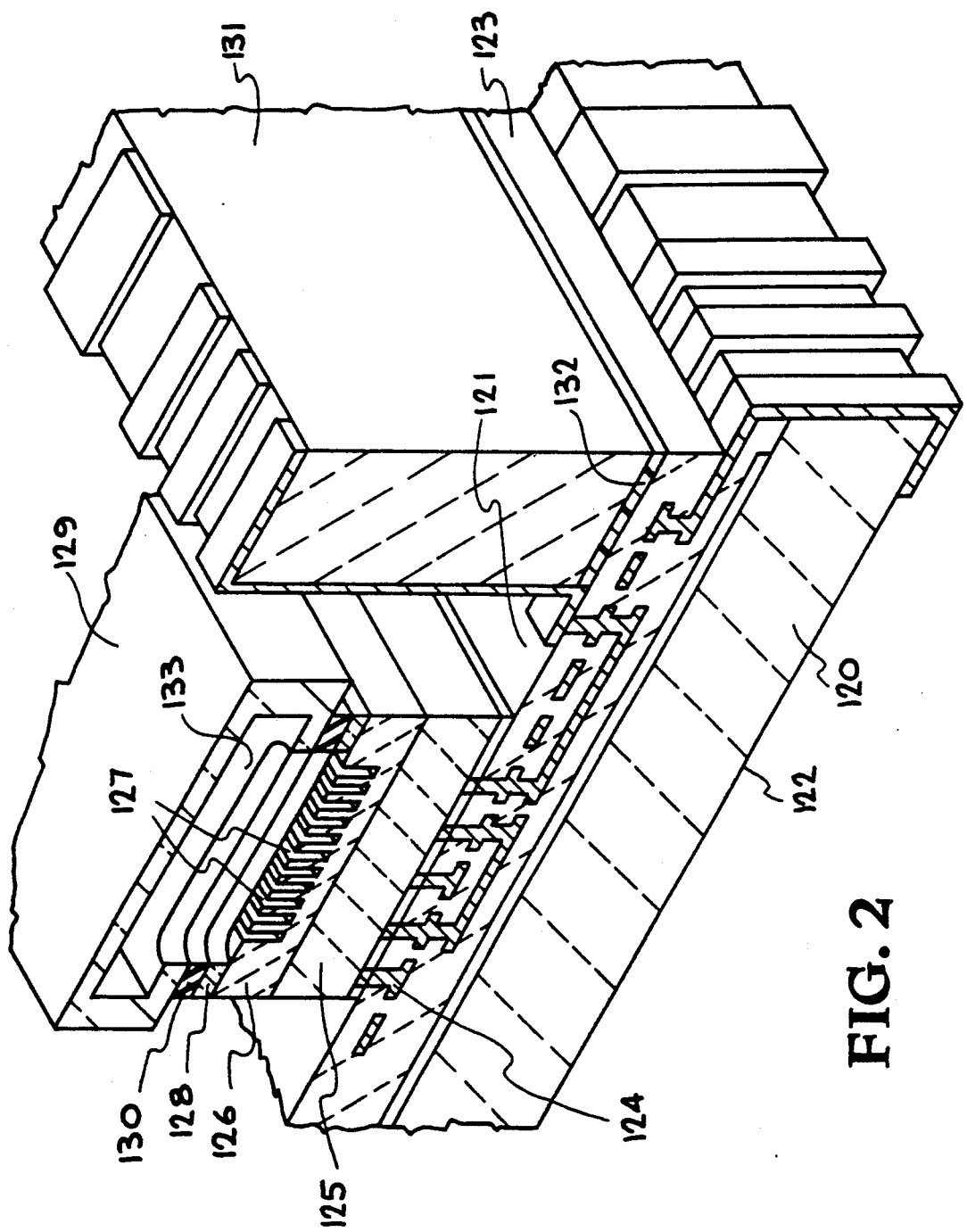
FIG. 2 is a cross-section view of a multi-chip module with flip-chip bonding and individual chip micro-channel cooling.

FIG. 2 shows a cross-sectional view of an integrated circuit chip 125, circuit board 120, perimeter wall 131, and coolant supply manifold 129 (sectioned in the Figure through a coolant supply channel 133), for a face down mounted integrated circuit package according to the present invention. As can be see, each circuit board 120 has a first major surface 121 and a second major surface 122. Near the first major surface 121 of the circuit board 120, a thin film, planarized interconnect 123 is formed. The interconnect 123 has chip bonding sites (e.g., 124) accessible at the first major surface. The chip bonding sites are adapted for flip-chip, solder bump, or controlled-collapse bonding to corresponding bonding sites on the integrated circuit chip 125. Bonded to, formed on, or otherwise essentially permanently (i.e., not intended to be separated in normal use) coupled with, the back of the integrated circuit chip 125 is a substrate 126 having a plurality of grooves (e.g., 127). A groove cover 128 is bonded to the grooved substrate 126 providing cooling channels along the grooves 127 in the substrate 126. Openings in groove cover 128 are provided at each end of the grooves 127 so that a coolant flow path is provided along the grooves. The chip, grooves, and groove cover are connected together to provide a replaceable integrated circuit module.

A coolant supply manifold 129 is then coupled to the groove cover 128 using a compressible elastomer seal 130. The compressible elastomer seal 130 surrounds openings in the coolant supply manifold at each end of the grooves 127 to confine flow of the coolant through the channels formed by the grooves. Also, the compressible elastomer seal 130 has sufficient thickness to account for variations in height of the chips due to manufacturing tolerances or other variations. The perimeter wall 131 for the module formed with the microchannel cooling has a height greater than the combined height of the flip-chip mounted integrated circuit 125, the microchannel groove substrate 126, the groove cover 128, the elastomer seal 130, and the coolant supply manifold 129. In the example illustrated, heat dissipation is assumed to be 150 W/cm$^2$ on 12×12 mm chips; the coolant supply channel 133 is sized to cool a pair of rows of 10 chips each using water as the coolant. The resulting perimeter wall height is about 7 mm. This perimeter wall is bonded using a eutectic bond 132.

The coolant used in the microchannel cooling system of FIG. 2 can be water, a dielectric fluid such as Coolanol (a silicate ester available from Monsanto, St. Louis, Mo.), air, or other cooling fluid or gas. Coolants with a large heat capacity and thermal conductivity allow for implementation with smaller dimensions to facilitate dense integrated circuit packaging.

Laser-patterned interconnects along the sides of the circuit board 120 and up the sides of the perimeter wall 131 are provided.

Figure 3:
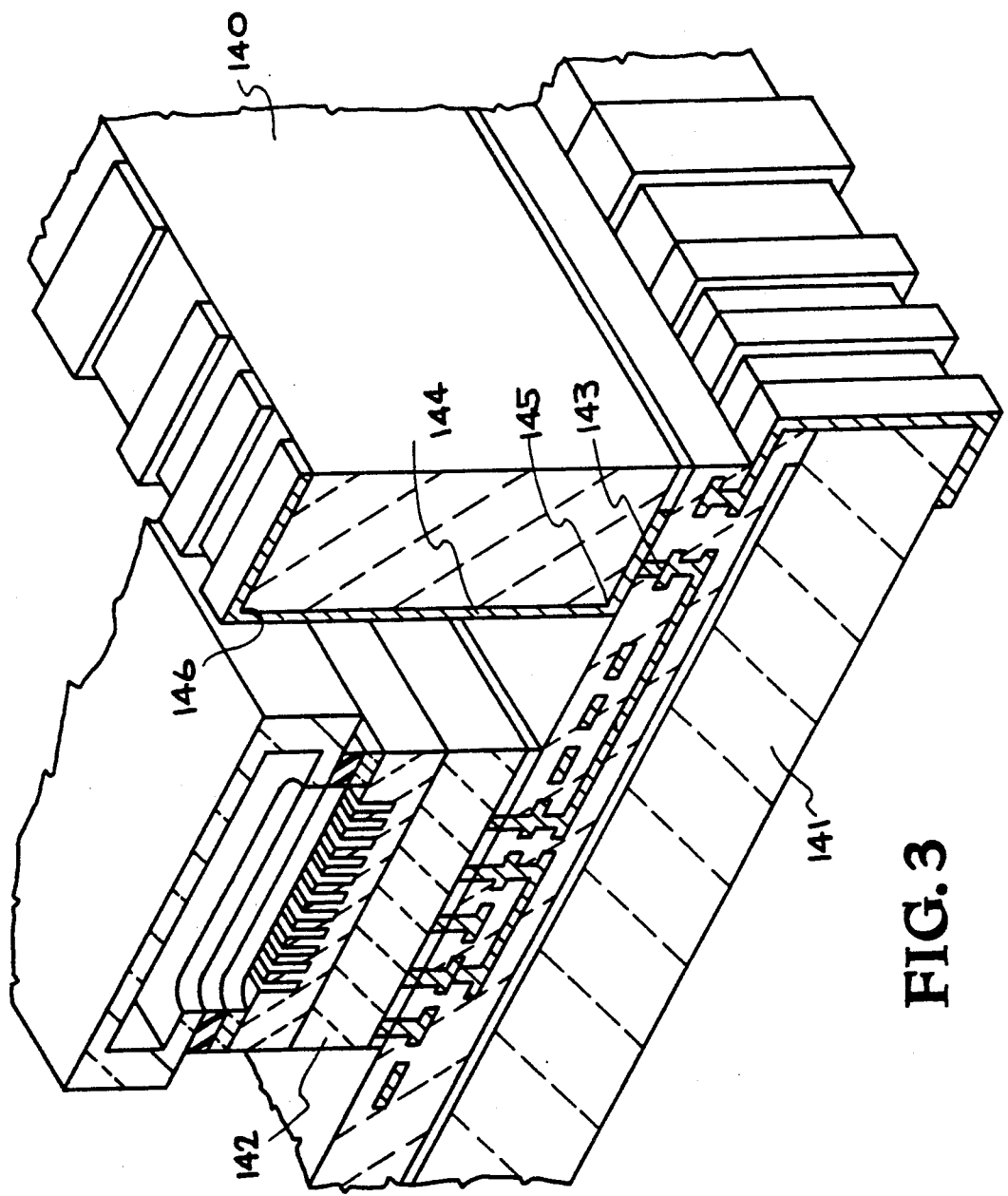
FIG. 3 is a cross-section view of an alternative technique for bonding the perimeter walls on the multi-chip modules using solder bump technology.

FIG. 3 illustrates an alternative technique for mounting the perimeter wall 140 on a circuit board 141. According to this technique, controlled-collapse, or solder bump bonding is used on both the top and bottom surfaces to mount the perimeter wall 140 on the circuit board, in the same manner as the chips 142 are mounted on the circuit board 141. Thus, the planar interconnect will include a bonding site 143 adapted for solder bump bonding to the conductors 144 on the perimeter wall. Conductors wrap around three sides of the perimeter wall and are formed using laser pantography. In this embodiment, the laser pantography is carried out in two steps, forming conductors around the bottom corner 145 in a first step and a top corner 146 in a second step.

Figure 4:
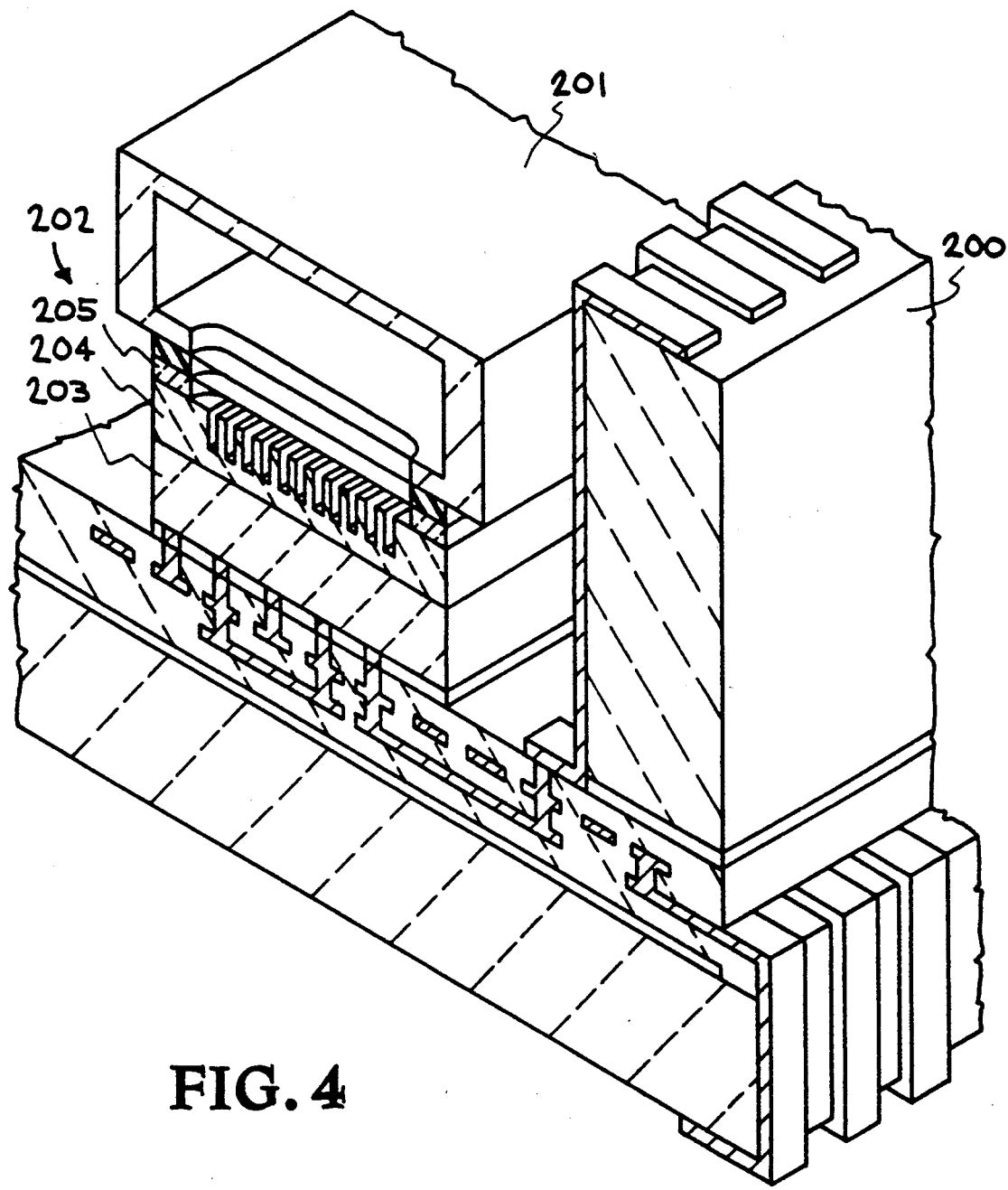
FIG. 4 is a cross-section view of an alternative multichip module with a microchannel cooling system adapted for air as the coolant.

FIG. 4 illustrates an example of an embodiment adapted for air cooling of pairs of rows of 10 chips each, where the chips generate about 20 W/cm$^2$. In this embodiment, the perimeter wall 200 may be approximately 10 mm high. This allows for a coolant supply manifold 201 approximately 5 mm high and an integrated circuit module 202, which includes the integrated circuit 203, the grooved substrate 204, and the cover 205, of approximately 3 mm in height.

Figure 5:
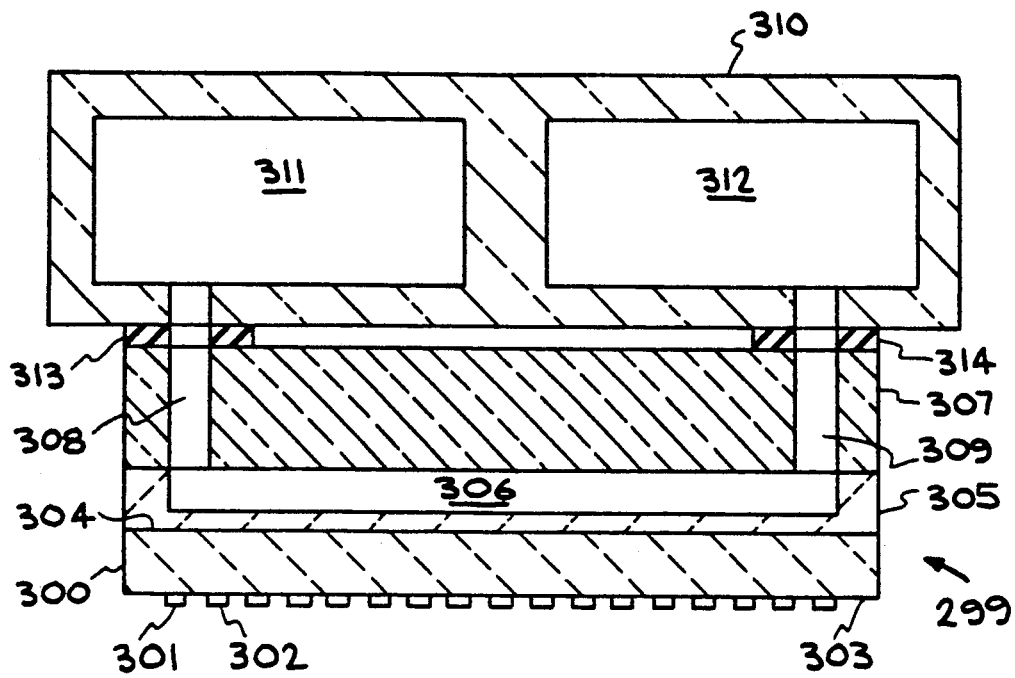
FIG. 5 is a cross-section view of an integrated circuit module with microchannel cooling, taken along the microchannel according to one embodiment of the present invention.

FIG. 5 provides a cross-sectional view of an integrated circuit module, generally 299, and coolant supply manifold 310 apart from the stacked interconnect system. According to this embodiment, each module 299 includes an integrated circuit chip 300 having a plurality of solder bump bonding sites (e.g., 301, 302) formed on a first major surface 303 of the chip 300. Also on the first major surface 303 an integrated circuit is formed on the chip.

The backside 304 of the integrated circuit chip is bonded to a microchannel structure 305 which includes a plurality of grooves 306. A microchannel cover manifold 307 is bonded to the microchannel structure 305. The cover manifold 307 is manufactured using glass or other material compatible with bonding to the microchannel structure 305. A glass cover may be bonded to a silicon microchannel heat sink using hot contact bonding. The cover manifold 307 includes coolant delivery channels 308, 309 which provide a coolant flow path through the cover manifold 307 to the grooves 306 in the microchannel structure 305.

The coolant delivery channels 308, 309 are fed coolant through a coolant supply manifold 310. The coolant supply manifold 310 includes a first flow path 311, and a second flow path 312. The first flow path 311 provides higher pressure coolant into the coolant delivery channel 308, while the flow path 312 provides a lower pressure path from the coolant delivery channel 309.

An elastomer seal 313 seals the junction between the flow path 311 and the coolant delivery channel 308, and elastomer seal 314 seals the junction between the coolant delivery channel 309 and the coolant flow path 312. The elastomer seals 313, 314 consist of a compressible material, such as neoprene, viton, or the like, which allows the coolant supply manifold 310 to be placed over the chip module 299 of FIG. 5 with sufficient pressure to form a seal for the coolant flow while allowing for differences in height of the integrated circuit modules on a given circuit board that arise due to manufacturing tolerances, warping, and the like.

Figure 6:
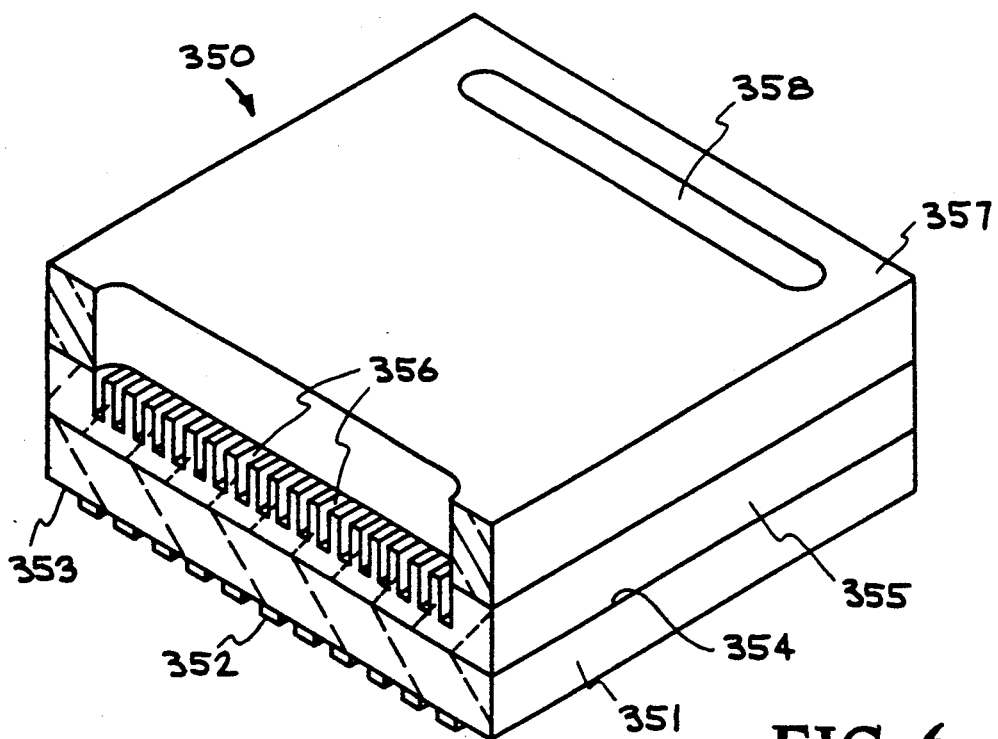
FIG. 6 is a perspective view of an integrated circuit module sectioned in two perpendicular directions with microchannel cooling according to the present invention.

FIG. 6 illustrates a cut-away perspective view of an integrated circuit module, generally, 350 according to the invention. The integrated circuit module 350 includes an integrated circuit chip 351 having solder bump bonding sites 352 along a first major surface 353 of the chip. The back surface 354 of the chip 351 is bonded to a microchannel structure 355. A plurality of microchannels 356 are formed in the microchannel structure 355. The cover manifold 357 is bonded to the microchannel structure 355. The coolant delivery channel 358 is cut or formed in the cover manifold 357 as illustrated.

Because the coolant supply manifold (310 of FIG. 5) is removable, and the solder bump bonding allows removal of each chip module individually, the present technique allows implementation of microchannel cooling on a chip by chip basis in a large circuit board. Furthermore, upon failure of an individual chip on the circuit board, the coolant supply manifold 310 can be removed, and individual integrated circuit modules 350 can be replaced as necessary.

Figure 7:
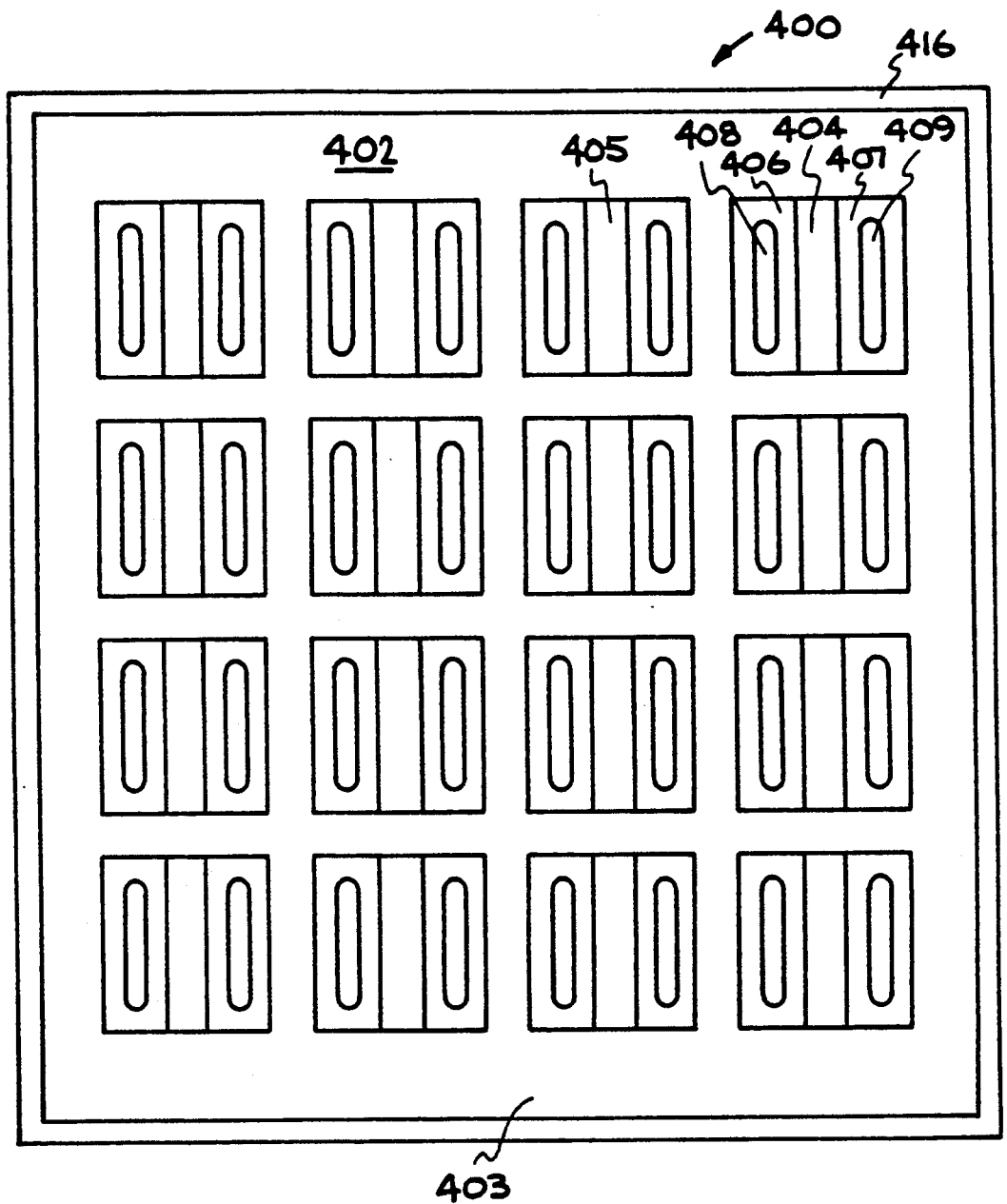
FIG. 7 is a schematic diagram of a multichip module with microchannel cooled integrated circuit modules on the circuit board.
Figure 8:
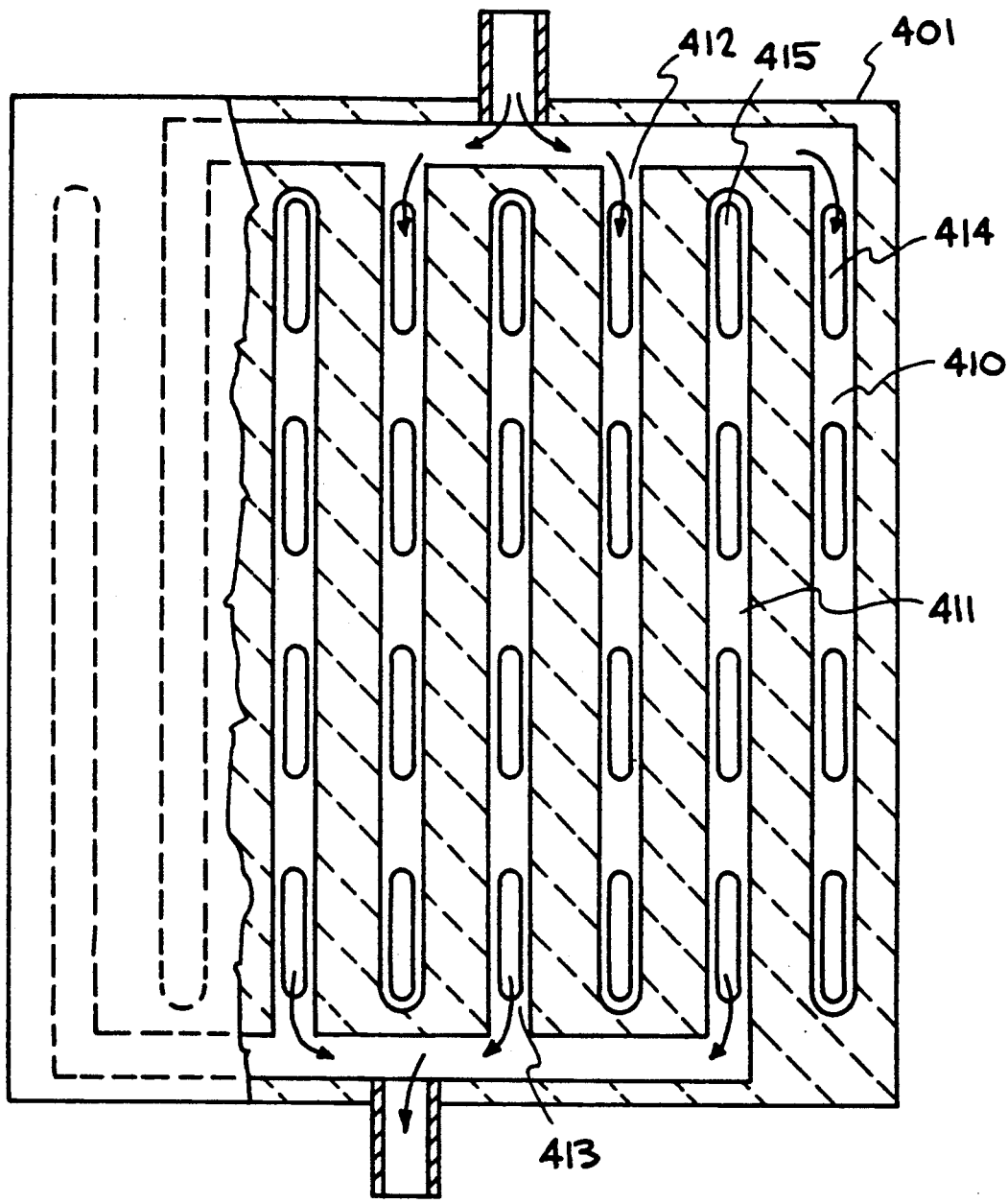
FIG. 8 is a schematic diagram of a coolant supply manifold for use with the multichip module of FIG. 7.

FIGS. 7 and 8 schematically illustrate a circuit board module 400 and a coolant supply manifold 401 for use with the microchannel cooled IC modules of FIGS. 5 and 6. As can be seen, the circuit board module 400 includes a circuit board 402 having a first major surface 403. A plurality of integrated circuit modules (e.g., 404, 405) are bonded to the circuit board 403 using flip-chip, or other face down bonding technology. Each of the integrated circuit modules includes an integrated circuit, a microchannel structure, and a cover manifold. An elastomer seal 406, 407 is provided around each of the coolant delivery openings 408, 409 in the coolant cover manifolds. Also illustrated heuristically in FIG. 7 is a perimeter wall 416 around the circuit board 402. Perimeter wall 416 may be implemented as illustrated in FIGS. 2, 3, or 4 to provide for an efficient interconnect structure in a stack of individually microchannel cooled integrated circuit modules.

The coolant supply manifold 401 (FIG. 8) includes a plurality of coolant supply channels (e.g., 410, 411, 412, 413). Channels 410 and 412 are higher pressure channels while channels 411 and 413 are lower pressure channels. The manifold 401 is adapted for placement over the printed circuit board module of FIG. 7 so that the openings (e.g., 414, 415) in the coolant supply channels (e.g., 410, 411) mate with the openings (e.g., 408, 409) in the individual integrated circuit modules (e.g., 404) on the circuit board 400. The elastomer seals 406 and 407 permit the coupling of the coolant supply manifold 401 with the integrated circuit modules 404 while accounting for manufacturing tolerances and preventing large forces on the integrated circuit which may lead to cracks or other failures in the devices.

In summary, a practical solution to cooling face down mounted integrated circuits has been provided. According to the invention, a die is attached to a microchannel heat sink, bonded to a cover manifold to establish a coolant flow path through the grooves in the microchannel heat sink. The heat sink may be made using silicon or other materials, with a cover manifold of glass. The integrated circuit is attached to the heat sink structure using a eutectic or other solder bond. Alternatively, the groove structure is formed directly in the back of the integrated circuit chip. This integrated circuit module may then be bonded face down to a circuit board.

A separate coolant supply manifold is provided. The coolant supply manifold is big enough in lateral dimensions to cover all or a subset of the integrated circuit modules on a given circuit board. For instance, a single coolant supply manifold may supply more than 100 chips per board. The coolant supply manifold has a number of coolant supply and removal lines, with holes or slots in the bottom which mate to the input and output structures on the respective integrated circuit modules. These mating contacts are surrounded by a sealing material to prevent leaks. The sealing material is sufficiently compliant, and elastic to allow for a range of compression. This range accommodates the difference in height of the various integrated circuit modules.

The coolant supply manifold can be attached or otherwise referenced to the circuit board or the circuit board holder. Tolerances in manufacturing this structure are quite lax, perhaps 0.2 mm out of 200 mm.

Accordingly, a structure is provided for efficient cooling of face down bonded integrated circuits, which preserves all of the main advantages of such bonds.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

What is claimed is:

1. An apparatus comprising:
    a circuit board;
    an integrated circuit chip having a first major side facing the circuit board, and a second major side;
    an integrated circuit on the chip, having a plurality of bond sites on the first major side of the chip;
    means for connecting the plurality of bond sites on the first major side of the chip to the circuit board;
    a microchannel structure essentially permanently coupled with the second major side of the chip providing a coolant flow path in heat flow communication with the chip;
    a removable coolant delivery manifold for delivering coolant to the microchannel structure; and
    a seal between the coolant delivery manifold and the microchannel structure.

2. The apparatus of claim 1, wherein the microchannel structure comprises a grooved substrate bonded to the second major side of the integrated circuit chip, and a cover manifold over the grooved substrate providing a coolant flow path to the grooved substrate.

3. The apparatus of claim 1, wherein the microchannel structure comprises a plurality of grooves in the second major side of the integrated circuit chip, and a cover manifold over the plurality of grooves providing a coolant flow path to the plurality of grooves.

4. The apparatus of claim 1, wherein the circuit board comprises a substrate having a thin film interconnect structure, the thin film interconnect structure including a plurality of bond sites coupled to the means for connecting.

5. The apparatus of claim 1, wherein the means for connecting comprise controlled-collapse bonds.

6. The apparatus of claim 1, wherein the seal comprises a compressible elastomer.

7. An apparatus comprising:
    a circuit board having a first major side, and a plurality of chip interconnects having bond sites accessible at the first major side;
    a plurality of integrated circuit modules mounted on the first major side of the circuit board, the integrated circuit modules including
        an integrated circuit having a plurality of bond sites on a first major side of the module,
        a plurality of grooves in a second major side of the module, and
        a cover manifold, having a first opening and a second opening, and bonded on the second major side of the module over the grooves to provide a coolant path from the first opening to the second opening through the plurality of grooves; and
    a coolant supply manifold providing a coolant path to cover manifolds of at least a subset of the plurality of integrated circuit modules;
    a seal between the coolant supply manifold and the subset of the plurality of integrated circuit modules; and
    means for connecting the plurality of bond sites on the integrated circuit modules to the bond sites of the chip interconnects on the circuit board.

8. The apparatus of claim 7, wherein the means for connecting provides for removable bonding to the circuit board so that integrated circuit modules may be selectively replaced.

9. The apparatus of claim 7, wherein the means for connecting comprise controlled-collapse bonds.

10. The apparatus of claim 7, wherein the seal comprises a compressible elastomer.

11. The apparatus of claim 7, wherein the integrated circuit modules comprise an integrated circuit chip, and the grooves are formed in a microchannel structure essentially permanently coupled with the chip.

12. The apparatus of claim 11, wherein the microchannel structure comprises a grooved substrate bonded to the integrated circuit chip.

13. The apparatus of claim 11, wherein the microchannel structure comprises a plurality of grooves formed in the integrated circuit chip.

14. The apparatus of claim 7, wherein the coolant supply manifold includes:
    a supply vessel having a plurality of ports for mating with the first openings on the cover manifolds of the integrated circuit modules on the circuit board; and a return vessel having a plurality of ports for mating with the second openings on the cover manifolds of the integrated circuit modules on the circuit board.

15. An apparatus comprising:
a stack of circuit boards having first and second major surfaces, and side surfaces, circuit boards in the stack including respective pluralities of chip interconnects having bond sites accessible at the first major surfaces, and respective pluralities of contact sites on the second major surfaces in electrical communication with the chip interconnects;
a plurality of integrated circuit modules mounted on the first major surface of a given circuit board in the stack in electrical communication with the bond sites of respective pluralities of chip interconnects, wherein the integrated circuit modules comprise
an integrated circuit having a plurality of bond sites on a first major side of the module facing the given circuit board, and
a microchannel structure in heat flow communication with the integrated circuit;
a plurality of perimeter wall members, mounted near perimeters of respective circuit boards in the stack, and spacing adjacent circuit boards in the stack apart;
a coolant supply manifold between the given circuit board and an adjacent circuit board in the stack providing a coolant path from a side of the stack to microchannel structures of integrated circuit modules on the given circuit board; and
a seal between the coolant supply manifold and the plurality of integrated circuit modules on the given circuit board.

16. The apparatus of claim 15, further including:
a first plurality of thin film board interconnects on the perimeter wall members, for interconnecting chip interconnects on circuit boards in the stack with contact sites on the second major surfaces of adjacent circuit boards.

17. The apparatus of claim 15, including removable bonds between the integrated circuit modules and the given circuit board so that the integrated circuit modules may be selectively replaced.

18. The apparatus of claim 17, wherein the removable bonds comprise controlled-collapse bonds.

19. The apparatus of claim 15, wherein the seal comprises a compressible elastomer.

20. The apparatus of claim 15, wherein the integrated circuit modules comprise an integrated circuit chip, having an integrated circuit on a first major surface, and the microchannel structure comprise a grooved substrate essentially permanently coupled with a second major surface of the chip.

21. The apparatus of claim 15, wherein the integrated circuit modules comprise an integrated circuit chip, having an integrated circuit on a first major surface, and the microchannel structure comprises a plurality of grooves in a second major surface of the chip.

22. The apparatus of claim 15, wherein the microchannel structure comprises:
a substrate having plurality of grooves, and
a cover manifold, having a first opening and a second opening, and bonded over the grooves near the second major surface of the module to provide a coolant path from the first opening to the second opening through the plurality of grooves.

23. The apparatus of claim 15, wherein the coolant supply manifold includes:
a supply vessel having a plurality of ports for mating with the microchannel structures on at least a subset of the plurality of integrated circuit modules on the given circuit board; and
a return vessel having a plurality of ports for mating with the microchannel structures on at least the subset of the plurality of integrated circuit modules on the given circuit board.

* * * * *